United States Patent [19]

Can

[11] Patent Number: 4,896,333

[45] Date of Patent: Jan. 23, 1990

[54] CIRCUIT FOR GENERATING A TRAPEZOIDAL CURRENT WAVEFORM WITH MATCHED RISE AND FALL TIMES

[75] Inventor: Sümer Can, Sunnyvale, Calif.

[73] Assignee: Signetics Corporation, Sunnyvale, Calif.

[21] Appl. No.: 81,409

[22] Filed: Aug. 4, 1987

[51] Int. Cl.[4] .......................... H04B 1/38; H04L 5/16
[52] U.S. Cl. .......................................... 375/7; 363/73; 307/261
[58] Field of Search ..................... 375/7, 8, 36, 94, 59, 375/68, 24; 307/260, 261, 262, 361, 113, 115; 363/62, 124, 73; 323/273, 275, 280, 281; 328/14; 340/537, 825.77, 870.27

[56] References Cited

U.S. PATENT DOCUMENTS

| | | | |
|---|---|---|---|
| 3,898,571 | 8/1975 | Caprio | 375/94 |
| 4,375,082 | 2/1983 | Lohrmann | 307/261 |
| 4,408,268 | 10/1983 | Peters et al. | 307/261 |
| 4,429,235 | 1/1984 | Minner | 307/261 |
| 4,539,491 | 9/1985 | Nishioka et al. | 307/261 |
| 4,571,507 | 2/1986 | Collings | 307/350 |
| 4,618,814 | 10/1986 | Kato et al. | 363/73 |
| 4,645,946 | 2/1987 | Ishikawa et al. | 307/262 |
| 4,675,594 | 6/1987 | Reinke | 363/73 |
| 4,675,651 | 6/1987 | Marbot et al. | 307/262 |
| 4,686,385 | 8/1987 | Sharpe | 307/261 |
| 4,725,788 | 2/1988 | Lodahl | 455/108 |

Primary Examiner—Robert L. Griffin
Assistant Examiner—Stephen Chin
Attorney, Agent, or Firm—David R. Treacy

[57] ABSTRACT

A transceiver device has a transmitter circuit for transmitting data from a local data terminal to a computer network. The transmitter circuit has a voltage-to-current converter including a voltage divider with a plurality of voltage threshold taps, each voltage tap having a fixed voltage level; and a plurality of differential current switches each having first and second differential inputs, and a current differential output. Each of the first differential inputs is connected in common for receiving a voltage signal, and the second differential inputs are connected to an associated one of the voltage threshold taps. The current switch outputs are directly connected to a common node, to provide a current signal stepwise the same as the voltage signal. Preferably the common node is connected to a current amplifier including a simple filter. The output current waveform is preferably a trapezoidal waveform having matched rise and fall times.

15 Claims, 6 Drawing Sheets

CIRCUIT FOR GENERATING A TRAPEZOIDAL CURRENT WAVEFORM WITH MATCHED RISE AND FALL TIMES

BACKGROUND OF THE INVENTION

1. Field of the Invention

This invention relates to a circuit for generating a current signal having a given current waveform, in particular a trapezoidal current waveform with substantially evenly matched rise and fall times; and to a pulse transmitter circuit such as those in a data terminal transceiver.

In computer communication systems having a local data terminal which communicates with a local area network (LAN) or a larger global computer network, a transceiver is used between the data terminal and the network. This invention is particularly useful with those networks in which a pulse is transmitted by applying predetermined values of current pulses to the network cable, rather than transmitting voltage pulses of a given voltage level into the LAN cable.

In integrated circuit technology, a typical transmitter circuit receives input data in the form of a low voltage differential input signal from the data terminal, and must generate output data in the form of a higher power output signal having a particular waveform to the network. During the transmission of the particular waveform over media such as coaxial cable, noise and interference may distort the signal, causing errors in data transmission. The magnitude of these errors is affected by the shape of the waveform and by the transmitter output impedance relative to the network impedance.

To enable accurate discrimination between signal and noise pulses, it may be especially desirable that data pulses be trapezoidal rather than square, and have closely matched rise and fall times. The matching of these times is more critical than their actual value.

2. Description of the Prior Art

A well-known transmitter circuit transmits data in the form of a voltage signal having a trapezoidal voltage waveform. The transmitter circuit has a differential amplifier, a pair of current sources, an input switching device, and an on-chip integrating capacitor. The capacitor is connected between the negative input of the differential amplifier and the differential output. The first current source is connected between the negative input of the differential amplifier to ground. The second current source, having the opposite polarity and twice the magnitude, is connected via the switching device to the negative input of the differential input, in parallel with the first current source.

In response to high to low differential transitions applied to the switching device of the transmitter circuit, the switch opens, and the capacitor charges at a constant rate of I/C volts/sec. Likewise, in response to low to high transitions applied to the switching device, the switch closes, and two current sources combine to discharge the capacitor at a constant rate of $-I/C$ volts/sec. Thus the known transmitter circuit generates a voltage signal having a trapezoidal waveform with matched rise and fall times.

Such a transmitter circuit is available from National Semiconductor as the DS 3662 Quad High Speed Transceiver.

Another circuit for providing a synthesized waveform which is a replica of an input pulse is taught by U.S. Pat. No. 3,898,571. The output pulse is obtained by summing the output voltages of a plurality of grated amplifiers. This circuit is of particular value in receivers which introduce pulse distortion via a logarithmic amplifier.

A disadvantage of the transmitter circuit described above is that there are no efficient conventional techniques to convert a voltage signal having a trapezoidal voltage waveform to a current signal having a similarly shaped current waveform without distorting the waveform characteristic. Such a voltage-to-current converter which produces a precise current waveform characteristic is particularly desirable for use in transmitter circuits, especially those used in transceivers which transmit data over a coaxial line by sinking current and receive data by sensing changes in voltage. More precisely transmitted current waveforms enable increased speed and accuracy of data communication between each terminal in the network.

SUMMARY OF THE INVENTION

An object of the invention is to provide an improved terminal-to-LAN transceiver and transmitter circuit.

Another object of the invention is to provide such a transmitter circuit which has a current output waveform, efficiently generated in response to an input voltage waveform.

Still another object is to convert a square pulse voltage waveform into a transmitted trapezoidal current waveform having well-matched rise and fall times.

A further object of the invention is to provide a circuit which converts a voltage signal having a particular voltage waveform into a current signal having a substantially similarly shaped current waveform.

Another object of this invention is to provide a circuit which converts a voltage signal having a particular voltage waveform with well-matched voltage rise and fall times into a current signal having a substantially similarly shaped current waveform having matching current rise and fall times.

A still further object is to enable efficient conversion of a trapezoidal voltage wave to a trapezoidal current wave.

In a transmitter according to the invention a voltage signal is applied to a current switching stage which includes a plurality of current switches having outputs connected directly to a common output node, for providing a low level current signal having a waveform at least stepwise similar to a desired output pulse waveform. A current amplifier receives input current from the common output node, and has an amplifier output connected to the network conductor for sinking current from the conductor. Preferably the amplifier includes a filter for smoothing the stepwise similar signal to a current pulse having the desired pulse waveform.

In a preferred embodiment of the invention, especially adapted for transmitting current pulses having closely matched rise and fall times, the current switches in the current switching stage are substantially identical. Each of these current switches is a differential switch, having first and second inputs, the first inputs being connected together for receiving a single ended voltage signal which, over a voltage range of interest, has closely matched rise and fall times. The second inputs of the current switches are connected to respective taps of a voltage divider having approximately equal voltage steps between the taps.

In an embodiment preferred where the peak value of the current pulse is to be controlled closely, the voltage level at the highest voltage tap is made sufficiently less than the maximum voltage of the voltage signal so that all current switches are fully turned on at the peak of the output trapezoid. It may also be desirable that the lowest tap provide a threshold voltage high enough so that, when the input voltage is at its minimum value between pulses, all of the current switches are fully turned off; that is, they do not provide any significant current into the common output node.

To provide a smooth trapezoidal waveform, a preferred transmitter according to the invention includes a smoothing filter in the current amplifier, so that the staircase appearance of the current waveform obtained from the switching stage is smoothed. Preferably the smoothing filter is a capacitor used as a compensating capacitor in the current amplifier.

Many data terminals are designed to provide a balanced, square pulse output waveform. A preferred embodiment of the invention, for use with such terminals, is a transceiver which includes a transmitter input stage for receiving a balanced voltage differential signal and converting this to a single ended voltage signal having a given low voltage and a given high voltage level. This single ended squarewave voltage signal is then supplied as an input to a waveshaping stage having an integrating capacitor. This stage provides closely matched charging and discharging currents to the capacitor, the one or the other being applied depending on the high or low voltage state of the single ended voltage signal. Where, as is usually the case, a trapezoidal output waveform is desired, this stage includes a clamping circuit which clamps the rising voltage on the capacitor at a given value such that there is always a time delay between charging and discharging; and clamps the capacitor voltage at a minimum value such that there is always some time delay between the falling slope of the trapezoid and the commencement of rise of the next trapezoidal pulse.

According to another aspect of the invention, a voltage-to-current converter circuit includes a plurality of differential current switches, connected so that as the voltage rises the switches are turned on consecutively, and as it falls they are turned off in reverse order. The switches are preferably identical, and each have a first and second input, an output, and a constant current source. All the first inputs are connected together directly to a common input node for receiving a voltage signal which is to be converted into a current signal. The outputs of the switches are connected to a common output node, at which a staircase current waveform is produced, stepwise similar to the input voltage waveform. Preferably, the second inputs of each of the switches are connected to respective taps of a voltage divider having equally spaced taps.

This converter circuit has the advantage that the scale factor of voltage-to-current can very easily be changed by varying the voltage applied to, or the current passed through, the voltage divider or by changing the reference level for the set of constant current sources being switched. The number of current switches and divider taps is selected according to a compromise between component simplicity which calls for a small number of switches, and closeness of staircase fit to the desired waveform, which calls for a large number of switches. The fact that many such switches exhibit a "soft switching" characteristic, 60 millivolt offset typically providing a .105-90% current switching, means that a relatively straight line characteristic can be obtained if the switch thresholds are 50 to 100 millivolts apart. At the same time it may be desirable to provide a different threshold voltage for the first tap of the divider, so that there is not significant current flow in the face of a zero input voltage.

The particular advantages of this converter circuit are that it does not exhibit any saturation effect at high current levels, and that the average slope of a rising or decaying input voltage is very accurately duplicated in the current waveform.

When this converter circuit is used to drive a current amplifier as an output stage, relatively high overall efficiency may be obtained because the constant currents through the differential switches are all low level currents.

The invention will be described in detail hereinafter with reference to embodiments shown in the drawings.

DESCRIPTION OF THE PREFERRED EMBODIMENTS

Figure 1:
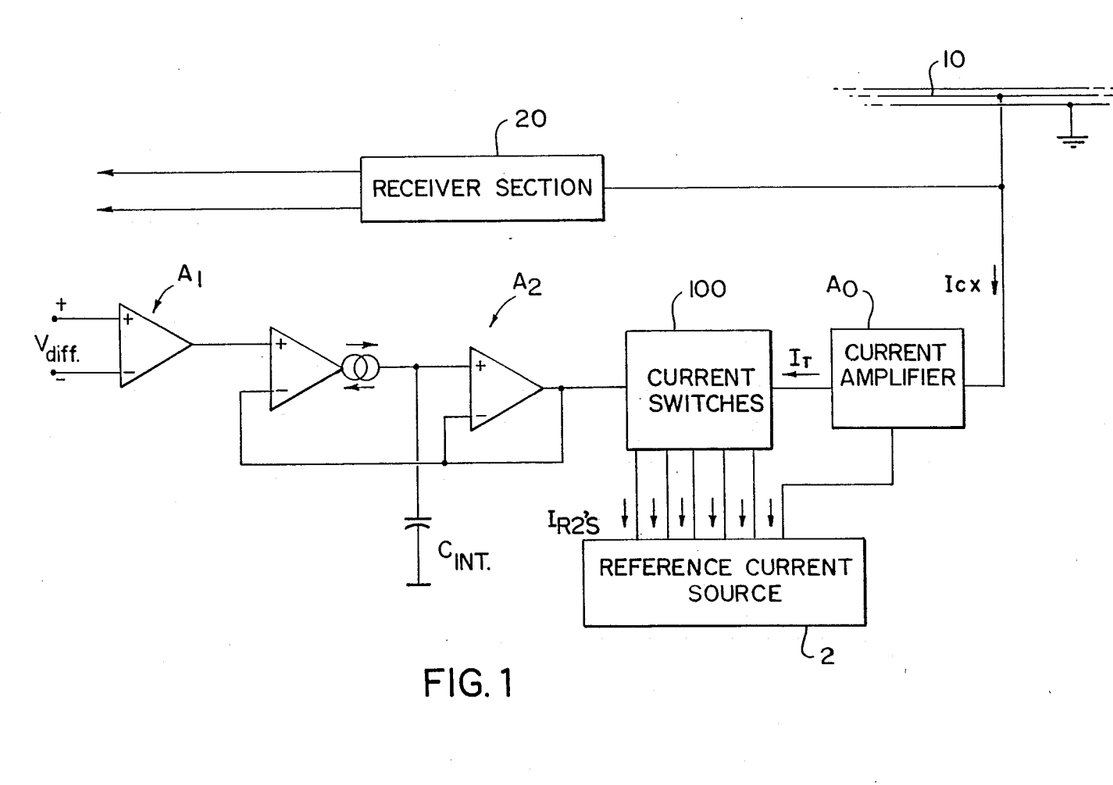
FIG. 1 is a block diagram of a pulse receiver and transmitter circuit in accordance with the invention.

FIG. 1 shows a block diagram of a transceiver which is the interface between a data terminal having a balanced output voltage, and a local area network which has a conductor 10 which carries data pulses. The receiver section 20 and the transmitter section may preferably be portions of one integrated circuit, or may be separate.

Figure 2:
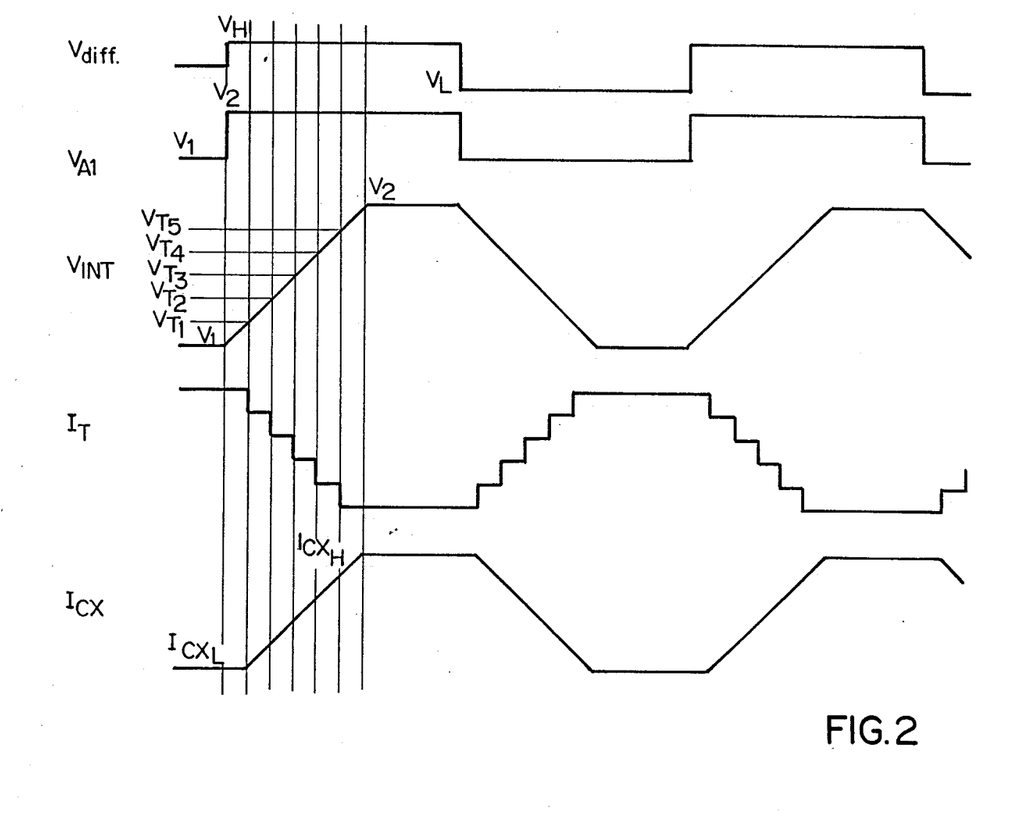
FIG. 2 is a pulse timing diagram showing input or output signals from certain blocks of FIG. 1.

The transmitter circuit includes an input stage $A_1$ which receives serial data pulses at a predetermined frequency or pulse width, typically in the form of a balanced voltage differential signal $V_{diff}$ having square pulses as shown in FIG. 2. The voltage differential signal has an arbitrary low voltage level $V_L$ and high voltage level $V_H$ unique to the circuitry of the data terminal. Input stage $A_1$ converts the voltage differential signal into a single-ended voltage signal $V_{A1}$ having square pulses, with a defined low voltage level $V_1$ and high voltage level $V_2$ as shown in FIG. 2.

A voltage wave-shaping stage $A_2$ including an integrating capacitor receives the single-ended voltage signal having a given voltage pulse width and produces a trapezoidal voltage signal $V_{INT}$ having a pulse width determined by that of the single-ended voltage signal. Preferably the trapezoidal voltage waveform has evenly matched rise and fall times. Alternatively, an isosceles-like triangular voltage waveform is also a suitable voltage waveform.

The voltage waveform $V_{INT}$ produced in stage $A_2$ is applied to the current-switching stage 100 of the voltage-to-current converter. Switching stage 100 produces a low level current signal having a waveform $I_T$ which is stepwise similar to the voltage waveform, and will thus have substantially equal current rise and fall times. The output current amplifier $A_O$ amplifies and filters the pre-amplified current waveform to generate the current $I_{CX}$ drawn from the network conductor, which causes the trapezoidal pulses to be transmitted.

The reference current source 2 provides the current sinking source needed to drive the differential transistor pairs of the current switches, and the amplifier circuits above.

Figure 3:
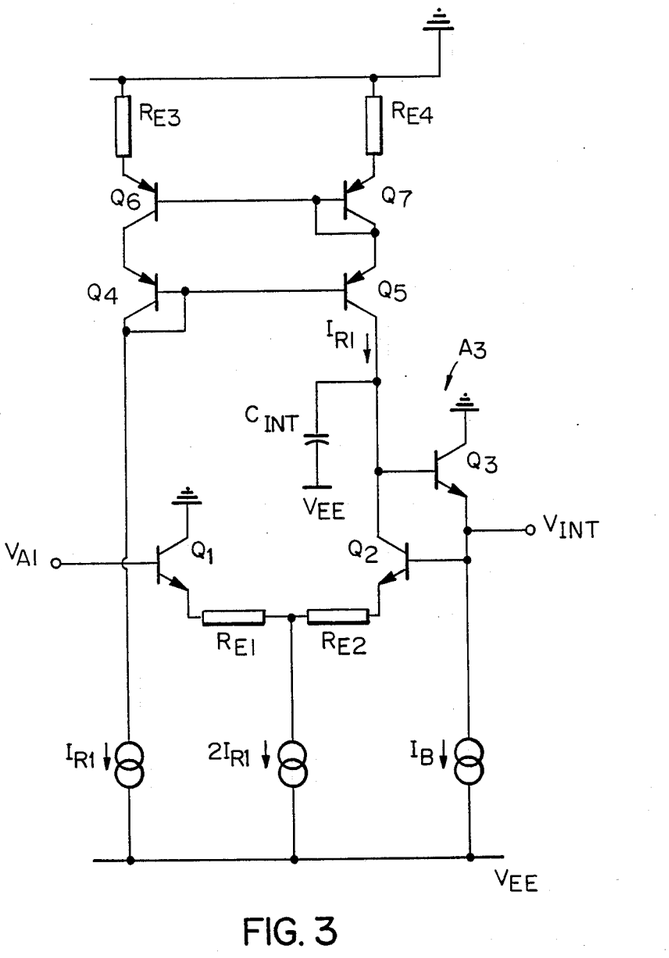
FIG. 3 is a schematic diagram of the voltage waveform shaping stages of the circuit of FIG. 1.

FIG. 3 is a schematic diagram of waveshaping stage $A_2$, which converts an arbitrary square waveform $V_{A1}$ into an internally defined waveform $V_{INT}$. Transistors $Q_1$ and $Q_2$ combine to form a differential pair having their emitters tied together and connected to a tail current source $2I_{R1}$. In the preferred embodiment current source $2I_{R1}$ equals 2 mA. Capacitor $C_{INT}$ and buffer/feedback stage $A_3$ integrate and clamp the internally defined square waveform $V_{A1}$ into a trapezoidal voltage waveform $V_{INT}$. Transistors $Q_1$ and $Q_2$ combine to form a differential pair having their emitters tied together and a tail current source $2I_{R1}$ connected to the tied emitters. The collector of transistor $Q_1$ is grounded, while the collector of transistor $Q_2$ is connected to capacitor $C_{INT}$, to the base of emitter follower transistor $Q_3$, and to the collector of transistor $Q_5$. As will be shown below, in response to the single-ended voltage signal at voltage levels $V_2$ and $V_1$, capacitor $C_{INT}$ charges and discharges at a substantially constant rate of $I_{R1}/C_{INT}$.

Transistors $Q_4$, $Q_5$, $Q_6$, and $Q_7$, and resistors $R_{E3}$ and $R_{E4}$, are configured to form a super Wilson mirror. A constant current source $I_{R1}$ is connected in series with the interconnected collector and base of transistor $Q_4$. Because of the current mirroring an identical current $I_{R1}$ flows through transistors $Q_5$ and $Q_7$. This is one half the value of the tail current $2I_{R1}$ of the differential pair. Thus by alternatively switching $Q_1$ and $Q_2$ on and off, a current $I_{R1}$ will either charge or discharge capacitor $C_{INT}$ at the same accurate and precise rate of $I_{R1}/C_{INT}$.

In response to $V_{A1}=V_2$, transistor $Q_1$ is turned on, transistor $Q_2$ is turned off, and current $I_{R1}$ flows through transistors $Q_7$ and $Q_5$ to charge capacitor $C_{INT}$ at a rate of $I_{R1}/C_{INT}$. The voltage at the collector of transistor $Q_{12}$ rises as $C_{INT}$ charges, while at the same time the stage output voltage $V_{INT}$ rises. Because of connection of the emitter of $Q_3$ to the base of $Q_2$, when $V_{INT}$ rises to the value $V_2$ of $V_{A1}$, transistor $Q_2$ also turns on and carries a current $I_{R1}$ so that charging of $C_{INT}$ stops.

When $V_{A1}$ drops to $V_1$, transistor $Q_1$ is turned off, transistor $Q_2$ is turned on, and current flows through transistor $Q_2$ at a constant value of $2I_{R1}$. Since only a current $I_{R1}$ flows through transistors $Q_5$ and $Q_7$ of the Wilson mirror, a current $I_{R1}$ flows from the capacitor $C_{INT}$, and the capacitor now discharges at a constant rate of $I_{R1}/C_{INT}$. Thus the voltage at the collector of transistor $Q_{12}$ decreases at a steady rate back to voltage $V_1$. Again, transistor $Q_3$ acts as a unity gain buffer so that the stage output voltage $V_{INT}$ at the emitter of transistor $Q_3$ follows the voltage at the collector of transistor $Q_2$, down to a voltage level $V_1$ where the differential pair $Q_1$ and $Q_2$ again are balanced at a current $I_{R1}$ each, and $V_{INT}$ stops falling.

Since the capacitor $C_{INT}$ charges and discharges at substantially the same rate $I_{R1}/C_{INT}$, a particular voltage waveform with a very evenly matched rise and fall time results.

Figure 4:
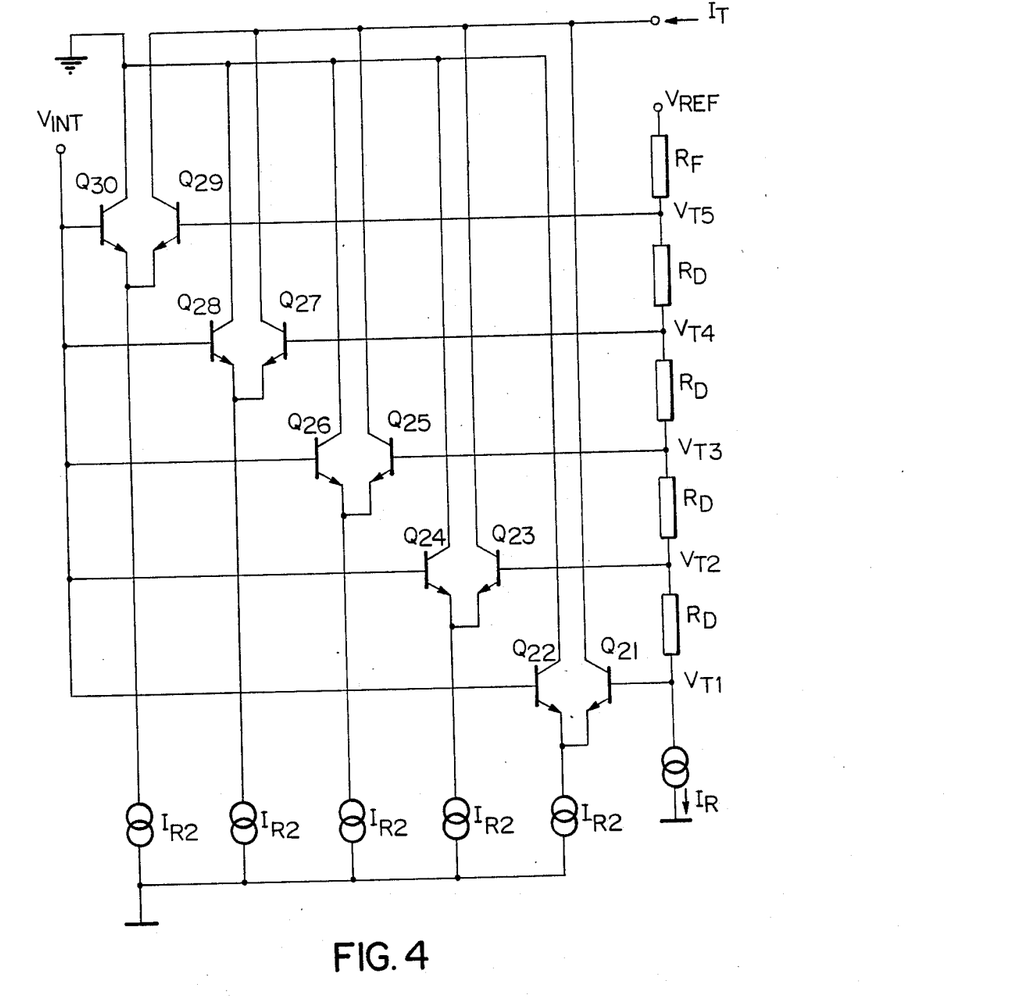
FIG. 4 is a schematic diagram of the voltage-to-current switching stage of the circuit of FIG. 1.

FIG. 4 is a schematic of the current switching stage which will convert the voltage signal $V_{INT}$ into a low level current signal $I_T$ having a stepwise similarly shaped current waveform shown idealistically in FIG. 2. Transistor pairs $Q_{21}$, $Q_{22}$; $Q_{23}$, $Q_{24}$; $Q_{25}$, $Q_{26}$; $Q_{27}$, $Q_{28}$; and $Q_{29}$, $Q_{30}$ each form a differential pair with a tail current source $I_{R2}$. The collectors of each transistor $Q_{21}$, $Q_{23}$, $Q_{25}$, $Q_{27}$ and $Q_{29}$ are all tied together at a common output node drawing the current $I_T$, while the collectors of transistors $Q_{22}$, $Q_{24}$, $Q_{26}$, $Q_{28}$ and $Q_{30}$ are connected to ground. Cascode transistors (not shown) may be connected respectively in series with the tail current source $I_{R2}$ to reduce spikes at the output caused by feedback from base to collector of the current sources.

A voltage divider is formed by five resistors, a current source and a reference voltage source $V_{REF}$. Threshold voltage taps $V_{T1}$, $V_{T2}$, $V_{T3}$, $V_{T4}$, and $V_{T5}$ have constant voltage outputs at fixed threshold values, and are connected respectively to the bases of transistors $Q_{21}$, $Q_{23}$, $Q_{25}$, $Q_{27}$ and $Q_{29}$. The bases of transistors $Q_{22}$, $Q_{24}$, $Q_{26}$, $Q_{28}$ and $Q_{30}$ are connected to a common stage input node receiving the voltage signal $V_{INT}$ from the wave-shaping stage $A_2$. Resistors $R_D$ between the taps are identical in value, while resistor $R_F$ between the voltage source $V_{REF}$ and tap $V_{T5}$ may be selected for convenience in scaling.

In the preferred embodiment $V_2=-4.9$ volts, $V_1=-6.3$ volts and the threshold voltages are spaced 200 mv apart. For preferred voltage threshold values of $V_{T1}=-6.0$ v, $V_{T2}=-5.8$ v, $V_{T3}=-5.6$ v. $V_{T4}=-5.4$ v and $V_{T5}=-5.2$ v, turn-off of transistors $Q_{22}$, $Q_{24}$ ... $Q_{30}$ is assured when $V_{INT}=V_1$; and full turn-on of all these transistors is also assured for $V_{INT}=V_2$ despite shifts in $V_{INT}$ due to variations or drift in component values.

As the voltage $V_{INT}$ rises from $V_1$ to $V_2$, and it sequentially exceeds the voltage thresholds $V_{T1}$, $V_{T2}$, $V_{T3}$, $V_{T4}$ and $V_{T5}$, and transistors $Q_{22}$, $Q_{24}$, $Q_{26}$, $Q_{28}$, $Q_{30}$ are progressively turned on. Similarly, when the voltage on the capacitor $C_{INT}$ falls from $V_2$ to $V_1$, then transistors $Q_{22}$, $Q_{24}$, $Q_{26}$, $Q_{28}$ and $Q_{30}$ are progressively turned off. This provides a polarity reversal, by which the current $I_2$ falls as the voltage $V_{INT}$ rises, to accommodate a corresponding reversal in the following amplifier stage.

Those of ordinary skill in the art will recognize that the graph of $I_T$ in FIG. 2 is idealized. In a practical integrated circuit using bipolar technology, with a 200 mv differential voltage between the bases of a differential pair, one will be essentially fully off. With a 60 mv differential, current sharing between the pair will be about a 1-to-10 ratio, while equal base voltages produce roughly equal currents. Thus in the preferred embodiment with 5 switches at 200 mv spacing, one switch is practically fully switched when the next has started to switch.

By using a greater number of switches, with more closely spaced divider tap voltages, a smoother rising and falling ratio of $I_T$ vs. time may be obtained. However, making the lowest step ($V_{T1}-V_1$) smaller raises the possibility that $I_T \neq 5I_{R2}$ between pulses; while making $V_2-V_5$ smaller raises the possibility that the zero value of the trapezoid will vary.

The advantage of having more switching pairs for an increasingly smoother output current waveform also leads to a design compromise, because of the disadvantage of increasing the area on the silicon chip to accommodate more switching pairs, and causing a decrease in the yield and reliability of the overall circuit.

A very precise and repeatable current waveform results from the circuit according to the invention. The output current amplitude of the current waveform may be adjusted simply by setting the reference for the current sources $I_{R2}$ in the converter circuit of FIG. 4. The rise and fall time of the current waveform are adjusted simply by either adjusting the reference voltage $V_{REF}$ or current $I_R$. Matching of the rise and fall times is controlled by adjusting the ratio of current sources $I_{R1}$ and $2I_{RI}$ that charge and discharge the capacitor $C_{INT}$ in the stage A2. An accurate and precise current waveform with closely matched rise and fall times thereby results because resistors and current sources can be very accurately and precisely produced when the circuit is embodied in a silicon chip. A further advantage of using switched current sources in a transmitter circuit of a transceiver device is that the output pulse amplitudes at both the maximum and minimum current levels are extremely well-defined. This is a very important quality in the transmitter circuit of any transceiver.

Figure 5:
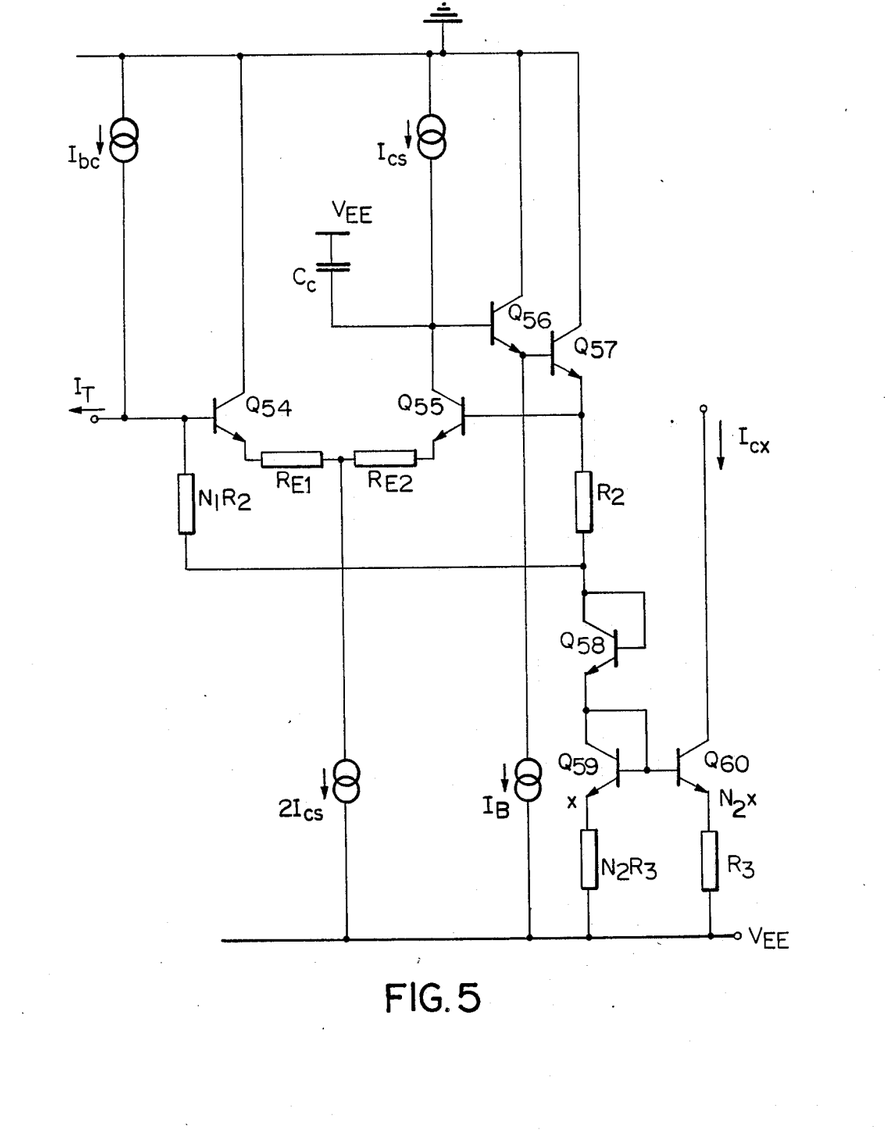
FIG. 5 is a schematic diagram of a current amplification stage of the circuit of FIG. 1.

The current amplifier circuit $A_O$ of FIG. 5 provides an accurately defined linear gain to amplify with minimum distortion the particular pre-shaped current waveform outputted as $I_T$.

Transistors $Q_{54}$ and $Q_{55}$ combine to form a differential pair having their emitters tied together and a tail current source $2I_{cs}$ connected to the tied emitters. The collector of transistor $Q_{54}$ is grounded, and the collector of transistor $Q_{55}$ is connected to a constant current source $I_{cs}$. Transistors $Q_{56}$ and $Q_{57}$ combine to form a Darlington pair which functions as a very accurate unity gain feedback buffer, having the base of transistor $Q_{56}$ connected to the collector of transistor $Q_{55}$, the collectors of transistors $Q_{56}$ and $Q_{57}$ connected to ground, the emitter of $Q_{56}$ and base of $Q_{57}$ connected to a current source $I_B$, and the emitter of transistor $Q_{57}$ connected to the base of transistor $Q_{55}$ and to the driving stage for the output mirror through transistor $Q_{58}$. The Darlington pair $Q_{56}$ and $Q_{57}$ minimize error caused by large base currents in other unity gain feedback buffers.

A compensation capacitor $C_c$ connected to current source $I_{cs}$ at the connection to the connector of transistor $Q_{55}$ and base of $Q_{56}$ also provides filtering, so that the output current is quite smooth. A small value of 2 picofarads has been found effective.

The differential pair $Q_{54}$, $Q_{55}$ and Darlington pair $Q_{56}$, $Q_{57}$ provide large current gain and a unity voltage gain feedback. This is so because the Darlington pair $Q_{56}$, $Q_{57}$ forces the voltage at the base of transistor $Q_{55}$ to be substantially equal to the input voltage at the base of transistor $Q_{54}$.

The base of transistor $Q_{58}$ is connected to its collector, so the transistor provides a relatively constant voltage drop for the combined voltage drop current $I_T$ passing through resistor $N_1R_2$, and amplified current $N_1I_T$ passing through resistor $R_2$, allowing a current $(N_1+1)I_T$ to pass into the next amplification stage. This results in a linear current gain of $N_1+1$.

Transistors $Q_{59}$ and $Q_{50}$ combine to form a current mirror, having resistor $N_2R_3$ connected between the emitter of transistor $Q_9$ and the negative voltage $V_{EE}$, and resistor $R_3$ connected between the emitter of transistor $Q_{60}$ and the negative bus. Labels "x" and "nx" represent the ratio of the emitter areas of each transistor on the silicon chip. Transistor $Q_{58}$ functions as a level shifting diode. Thus in response to the current $(N_1+1)I_T$ passing through diode $Q_{58}$, a total current $N_2(N_1+1)I_T$ is drawn as current $I_{cx}$ through output transistor $Q_{60}$. In this particular design, for example, a first amplification stage value of $N_1=8$, and a final amplification stage of $N_2=4$, results in a total current gain of 36.

Thus it is possible that a low level current signal, having a trapezoidal waveform shape with a well defined rise/fall time generated at an amplitude of 2mA, may then be amplified to 72mA without distorting the current waveform.

In this circuit the current gain is determined by the various resistor ratios. Such resistor ratios are well controlled parameters in integrated circuit technology.

Figure 6:
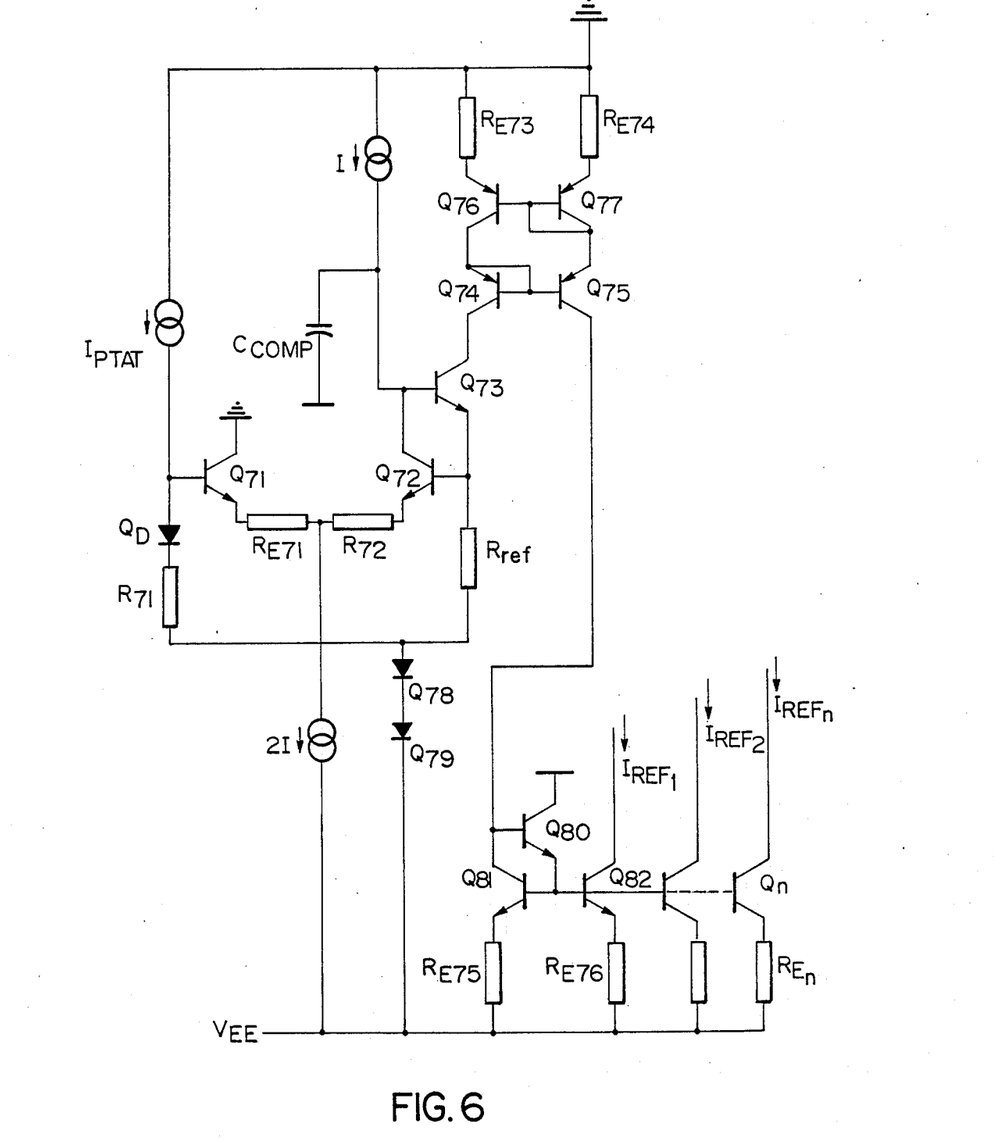
FIG. 6 is a schematic diagram of a circuit that generates reference currents used in the circuit of FIG. 1.

FIG. 6 shows a current reference source that can be a typical building block for the source 2. Transistors $Q_{71}$ and $Q_{72}$ form a differential pair having its emitters tied and connected through resistors $R_{E71}$, $R_{E72}$ to tail current 2I. Transistor $Q_{73}$ forms a unity gain buffer. Current source $I_{PTAT}$ allows a current to flow which is proportional to absolute temperatures. Diode $Q_D$ provides a decrease in voltage proportional to temperature, and resistor $R_{71}$ n increase in voltage proportional to temperature; thus the voltage drops across $Q_D$ and $R_{71}$ compensate for one another during temperature change. Capacitor $C_{comp}$ is a compensating capacitor and diode $D_{78}$ and $D_{79}$ are level shifting diodes. This circuit results in current flow through resistor $R_{ref}$ which is substantially not effected by changes in ambient temperature.

Transistors $Q_{74}$, $Q_{75}$, $Q_{76}$ and $Q_{77}$ combine to form a super Wilson mirror. Transistors $Q_{80}$, $Q_{81}$ $Q_{82}$ ... $Q_n$ also combine to form a feedback mirror, producing typical reference currents $I_{ref}$.

The voltage-to-current stage of FIG. 4 may be used by itself to provide a current wave which is stepwise similar to a voltage wave in applications unrelated to a terminal-to-LAN transceiver. In such circumstances it may be desirable that the voltage range of the divider taps exceeds or is at least approximately equal to the peak voltage range of the voltage signal to be converted. Connection of the collectors to ground, and to the common output node, may be interchanged so that the current $I_T$ rises for rising voltage $V_{INT}$.

The embodiments described above are intended for use with bipolar technology and a negative voltage supply, where the LAN typically has a 50 ohm impedance and a signal conductor at ground potential. Those of ordinary skill will recognize that many alternatives to these embodiments fall within the scope of the invention. For example, the circuits or portions thereof may be MOS types, and may be of any polarity or grounding arrangement. The input stage or wave-shaping stage may not be required, or may have substantially different forms. The output need not be a current mirror. Thus the scope of the invention should be limited only by the appended claims.

What I claim is:

1. A voltage-to-current converter circuit comprising:
   a common input node for receiving a voltage signal,
   a reference voltage source,
   a voltage divider connected to said reference voltage source, having a plurality of taps providing threshold voltages, and
   a plurality of differential current switches, each current switch having a respective first and second input, a constant current source, and an output, each switch being arranged for switching a controlled portion of the current from the respective constant current source to the respective output, responsive to a voltage at said first input relative to a voltage at the said second input; and first inputs all being connected directly to said common input node, said outputs all being connected directly to a common output node, and said second inputs being connected respectively to said taps on said divider, whereby current through said output node has a waveform which is stepwise substantially similar to said voltage signal.

2. A circuit as claimed in claim 1, especially adapted to provide a trapezoidal current waveform in response to receipt of a trapezoidal voltage signal having a given maximum value, characterized in that the voltage steps between taps of said divider are substantially equal, and said differential current switches are substantially identical.

3. A circuit as claimed in claim 1, especially adapted to provide a trapezoidal current waveform in response to receipt of a trapezoidal voltage signal having a given maximum value, characterized in that the voltage steps between taps of said divider are substantially equal, and said differential current switches are substantially identical, and said circuit comprises current amplifying means having a current input node connected to said output node, and a capacitor connected to said current amplifying means for providing a smoothly varying trapezoidal output current in response to said trapezoidal voltage signal.

4. A circuit as claimed in claim 1, characterized in that said voltage signal has a given maximum value, and said reference voltage source has a value at least approximately equal to said given maximum value.

5. A transmitter circuit for transmitting pulses to a network of the type in which pulses are transmitted by sinking current from a network conductor, comprising:

current switching means comprising a plurality of current switches having outputs connected directly to a common output node, for providing a low level current signal having a waveform at least stepwise similar to a desired output pulse waveform, in response to receipt of a voltage signal having the desired output pulse waveform, means for providing a voltage signal having said desired output pulse waveform to said current switching means, and a current amplifier, receiving input current from said common output node, and having an amplifier output connected to said network conductor for sinking current from said conductor, said amplifier comprising filter means for smoothing said stepwise similar signal to a current output pulse having said desired pulse waveform.

6. A circuit as claimed in claim 5, comprising a reference source, and a voltage divider connected to said reference source, having a plurality of taps providing threshold voltages, characterized in that said current switching means is a differential means having a plurality of first and second differential inputs, a current switching differential output, and a corresponding plurality of tail current sources each having a constant tail current value of I, each of said second differential inputs being connected to an associated one of said voltage threshold taps, and each of said first differential inputs being connected together for receiving said voltage signal in common;

in response to said voltage signal with respect to each of said plurality of voltage threshold taps, said differential means controls the current flow through said current switching differential output by each of said plurality of tail current sources to produce a current signal having a current waveform shaped stepwise similar to said voltage signal.

7. A circuit as claimed in claim 6, wherein said voltage divider comprises a resistor ladder having five voltage taps each with a separate voltage level; and said differential means comprises five differential amplifiers, each of said differential amplifiers having a first and second differential input and a tail current source, each of said second differential inputs being connected to an associated one of said voltage taps, and each of said first differential inputs being connected together for receiving said voltage signal in common.

8. A circuit as claimed in claim 5, wherein said means for providing a voltage signal comprises integration means for receiving a single-ended voltage signal and in response thereto producing a trapezoidal voltage signal proportional to said single-ended voltage signal, and in response to said trapezoidal voltage signal, said current switching means produces said current signal having a trapezoidal current waveform stepwise substantially similar to said trapezoidal voltage waveform.

9. A circuit as claimed in claim 8, wherein said trapezoidal voltage signal has a trapezoidal voltage waveform with substantially equal rise and fall times; and in response to said trapezoidal voltage signal said current switching means produces said current signal having a trazezoidal current waveform with substantially equal rise and fall times.

10. A circuit as claimed in claim 9, wherein said integration means comprises at least one capacitor.

11. A transceiver device comprising a receiver section and a transmitter circuit for transmitting data from a local data terminal to a computer network, said transmitter circuit comprising:

(a) an input means for receiving a differential input signal from said data terminal having an arbitrary high and low voltage level and a given pulse width, and converting said differential input signal into a single-ended voltage signal having internally well-defined high and low voltage levels;

(b) an integrator means comprising differential means having a first and second differential input, an integrator tail current source with a constant current value 2I, and a single-ended output, said first differential input being connected for receiving said single-ended voltage signal;

current source means having a constant current value I, said current source means being connected to said single-ended output;

a capacitor means also being connected to said differential means and having a predetermined capacitive value C;

negative feedback means for connecting said single-ended output to said second differential input, in response to said single-ended voltage signal on said first differential input with respect to said second differential input, said differential means and current source means combining to control current flow charging or discharging said capacitor means at a constant value of I/C or −I/C respectively, to produce an integrated voltage voltage signal on said second differential input proportional to said single-ended voltage signal with respect to said given pulse width, said integrated voltage signal having a particular voltage waveform; and (c) current switching means comprising:
voltage threshold means having a plurality of voltage threshold taps, each of said voltage threshold taps having a separate voltage level;
current differential means having a plurality of first and second differential switcher inputs, a current switching differential output, and a corresponding plurality of switcher tail current sources each having a constant current value, each of said plurality of second differential switcher inputs being connected to an associated one of said voltage threshold taps, each of said plurality of first differential switcher inputs being connected to said single-ended output of said integrator means for receiving said integrated voltage signal;
in response to comparison of said integrated voltage signal with respect to each of said separate voltage levels of said plurality of voltage threshold taps, said differential means controlling the current flow through said current switching differential output by each of said plurality of switcher tail current sources to produce a current signal having a current waveform shaped substantially similar to said particular voltage waveform of said integrated voltage signal.

12. A transceiver device as claimed in claim 11, wherein said integrator means produces an integrated voltage signal having a trapezoidal voltage waveform; and in response to said integrated voltage signal, said current switching means produces said current signal having a trapezoidal current waveform shaped substantially similar to said trapezoidal voltage waveform.

13. A transceiver device as claimed in claim 11, wherein
said voltage threshold means comprises five voltage taps; and
said current differential means comprises five differential amplifiers, each of said differential amplifiers having a first and second switcher differential input, and a switcher tail current source, each of said second differential inputs being connected to a respective one of said voltage threshold taps, each of said first differential switcher inputs being connected together for receiving said integrated voltage signal in common.

14. A transceiver device as claimed in claim 12, wherein said capacitor means comprises at least one capacitor.

15. A transceiver device as claimed in claim 11, wherein said integrator means produces an integrated voltage signal having a trapezoidal voltage waveform with substantially equal rise and fall times within said given pulse width; and in response to said integrated voltage signal said current switching means produces said current signal having a trapezoidal current waveform with substantially equal rise and fall time substantially similar to said trapezoidal voltage waveform.

* * * * *